(12) United States Patent
Xiao et al.

(10) Patent No.: US 7,563,729 B2
(45) Date of Patent: Jul. 21, 2009

(54) METHOD OF FORMING A DIELECTRIC FILM

(75) Inventors: Shiqin Xiao, Kawasaki (JP); Takayuki Ohba, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 264 days.

(21) Appl. No.: 11/135,648

(22) Filed: May 24, 2005

(65) Prior Publication Data

US 2005/0282400 A1    Dec. 22, 2005

Related U.S. Application Data

(63) Continuation of application No. PCT/JP03/00369, filed on Jan. 17, 2003.

(51) Int. Cl.
*H01L 21/469* (2006.01)
(52) U.S. Cl. .............. 438/783; 257/E21.576; 438/240; 438/287; 438/785
(58) Field of Classification Search .......... 438/775, 438/769, 785, 786, 240, 287, 783; 257/E21.576
See application file for complete search history.

(56) References Cited

U.S. PATENT DOCUMENTS

| 6,306,777 | B1 | 10/2001 | Ogle, Jr. et al. | |
|---|---|---|---|---|
| 6,348,420 | B1 | 2/2002 | Raaijmakers et al. | |
| 6,706,581 | B1* | 3/2004 | Hou et al. | 438/216 |
| 2001/0023120 | A1 | 9/2001 | Tsunashima et al. | |
| 2002/0105048 | A1 | 8/2002 | Matsushita et al. | |
| 2002/0106536 | A1 | 8/2002 | Lee et al. | |
| 2002/0172768 | A1 | 11/2002 | Endo et al. | |
| 2003/0072975 | A1* | 4/2003 | Shero et al. | 428/704 |
| 2004/0023461 | A1* | 2/2004 | Ahn et al. | 438/287 |
| 2005/0269651 | A1 | 12/2005 | Chen et al. | |

FOREIGN PATENT DOCUMENTS

| JP | 11-177057 | 7/1999 |
|---|---|---|
| JP | 2001/152339 | 6/2001 |
| JP | 2002-60944 A | 2/2002 |
| JP | 2006-511934 A | 4/2006 |
| KR | 2002-0064624 | 8/2002 |
| WO | WO 97/40533 | 10/1997 |

OTHER PUBLICATIONS

Office Action issued in corresponding Chinese Application No. 038256304.
Korean Office Action mailed Aug. 30, 2006, issued in corresponding Korean Application No. 10-2005-7011048.
Japanese Office Action mailed Apr. 22, 2008, corresponding to Japanese Application No. 2004-567105.
Japanese Office Action mailed Jul. 29, 2008; issued in corresponding Japanese Application No. 2004-567105.

* cited by examiner

*Primary Examiner*—Asok K Sarkar
(74) *Attorney, Agent, or Firm*—Westerman, Hattori, Daniels & Adrian, LLP.

(57) ABSTRACT

A method of forming a dielectric film on a substrate surface includes the steps of forming the dielectric film on the substrate surface in plural steps, and reforming, in each of the plural steps of forming the dielectric film, the dielectric film in an ambient primarily of nitrogen.

14 Claims, 20 Drawing Sheets

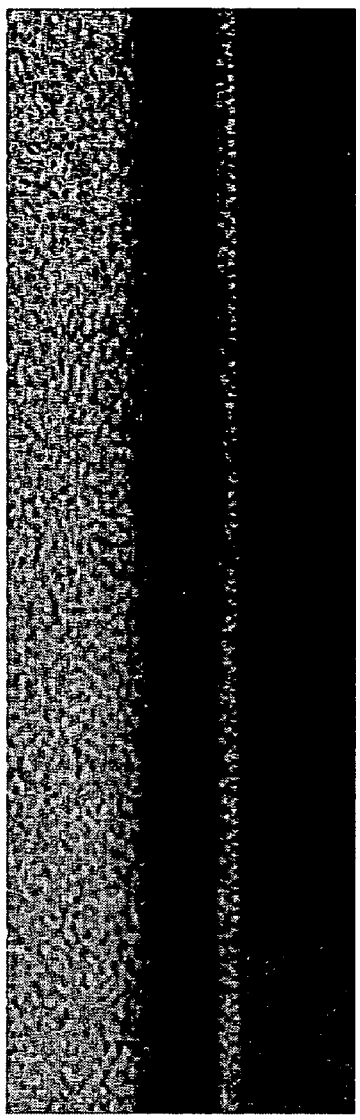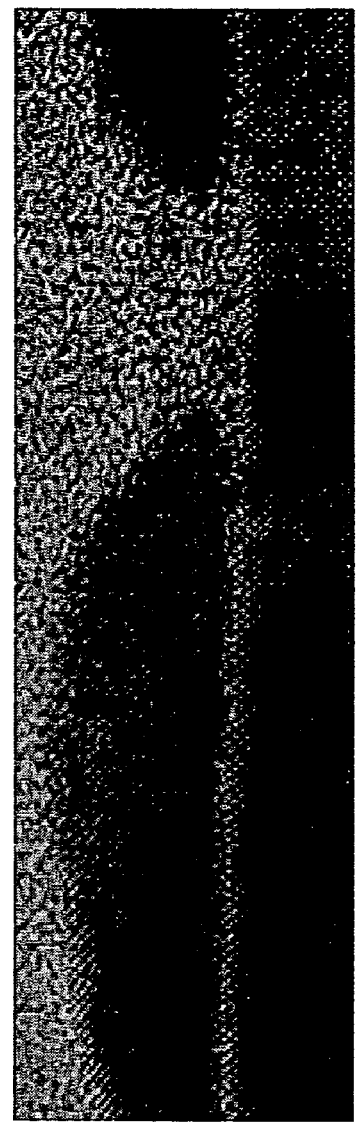
FIG.1A
FIG.1B

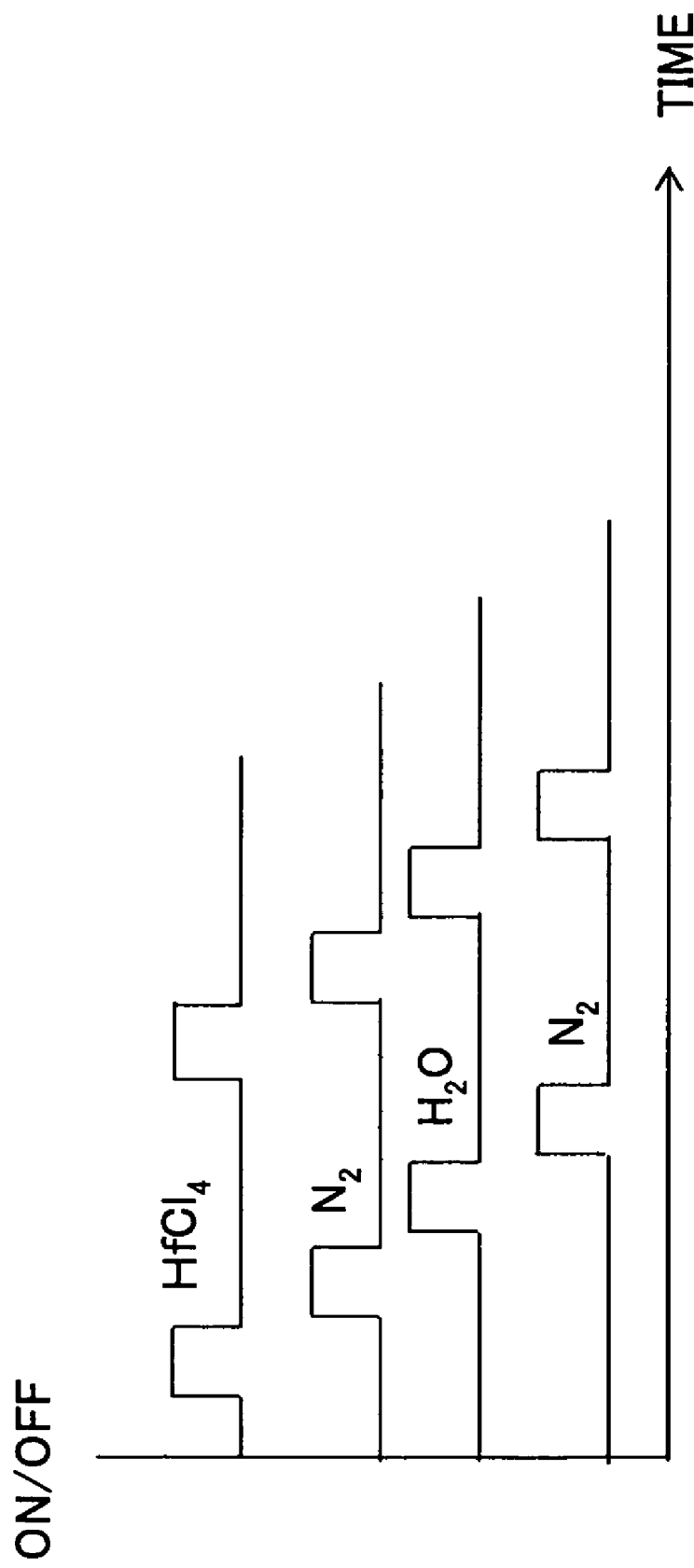

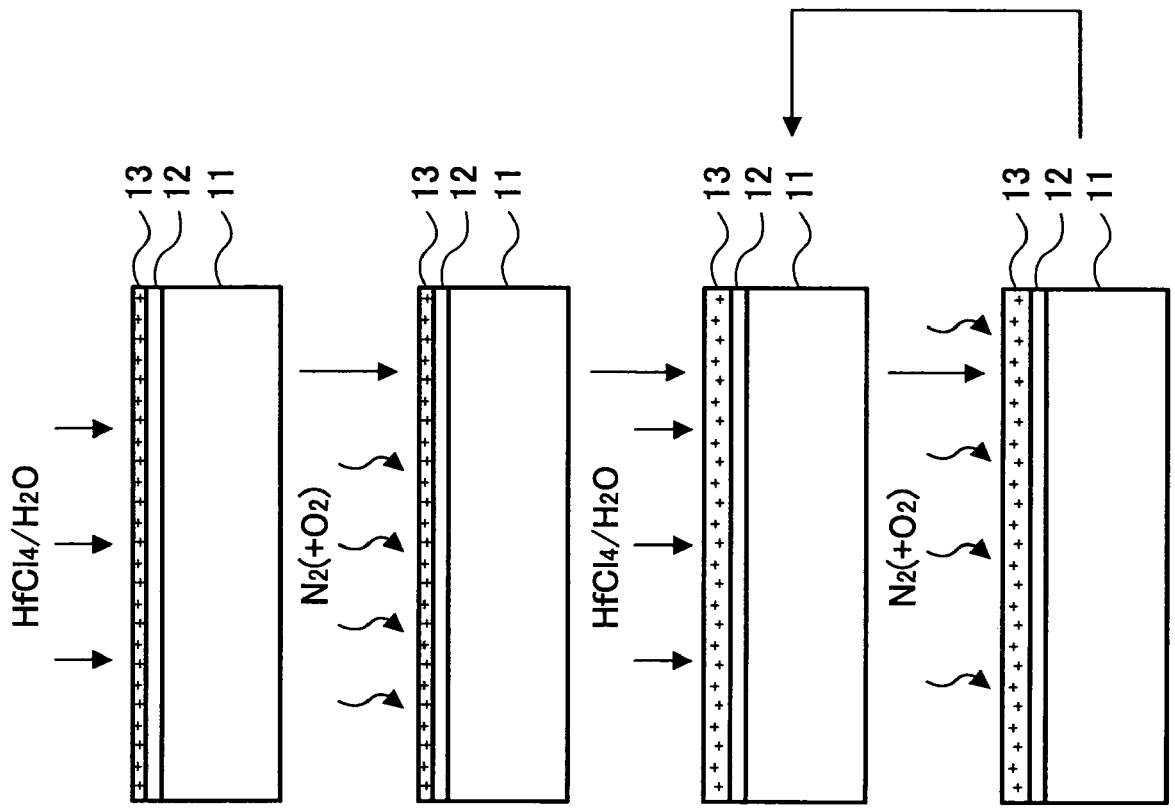

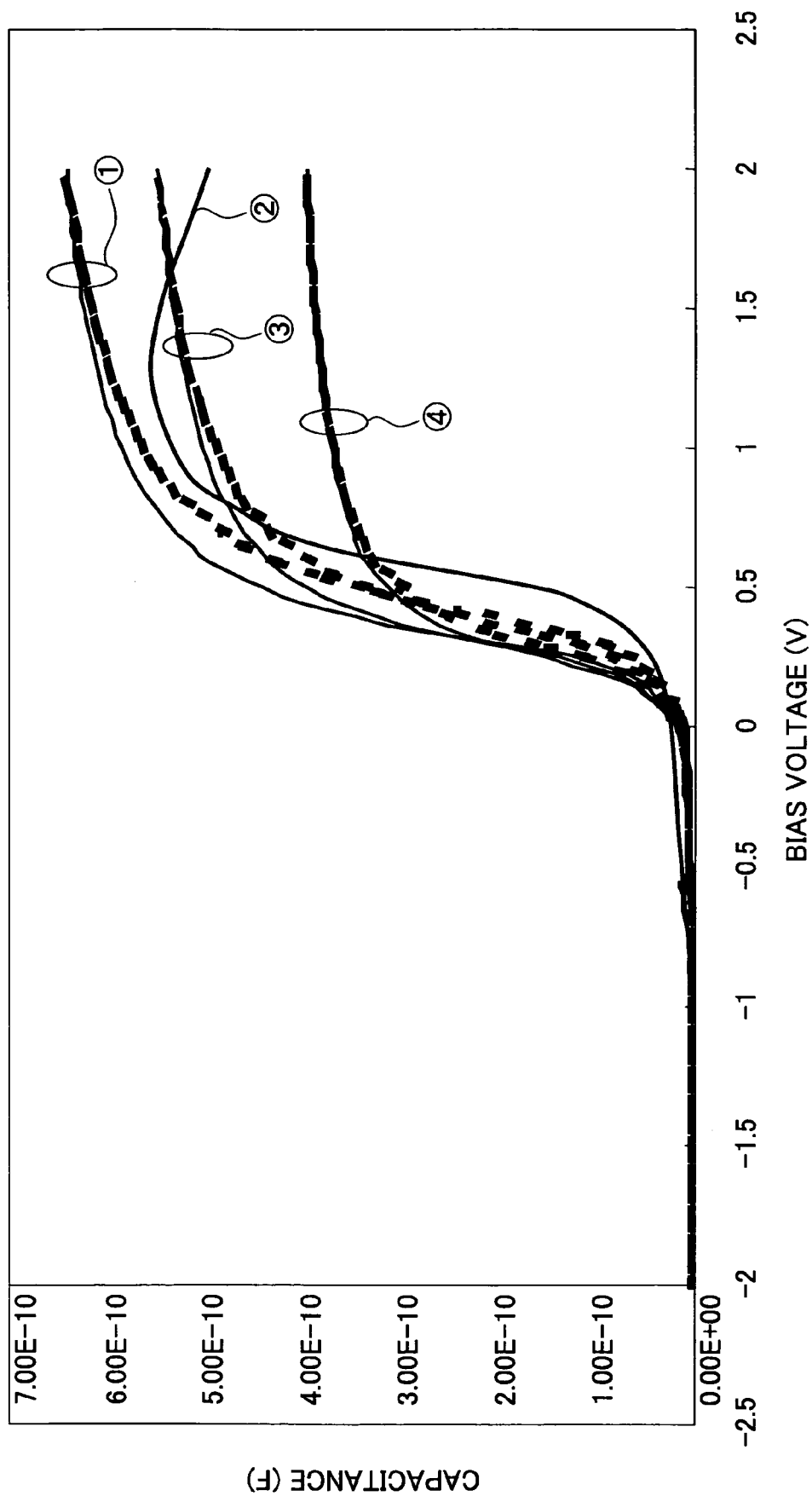

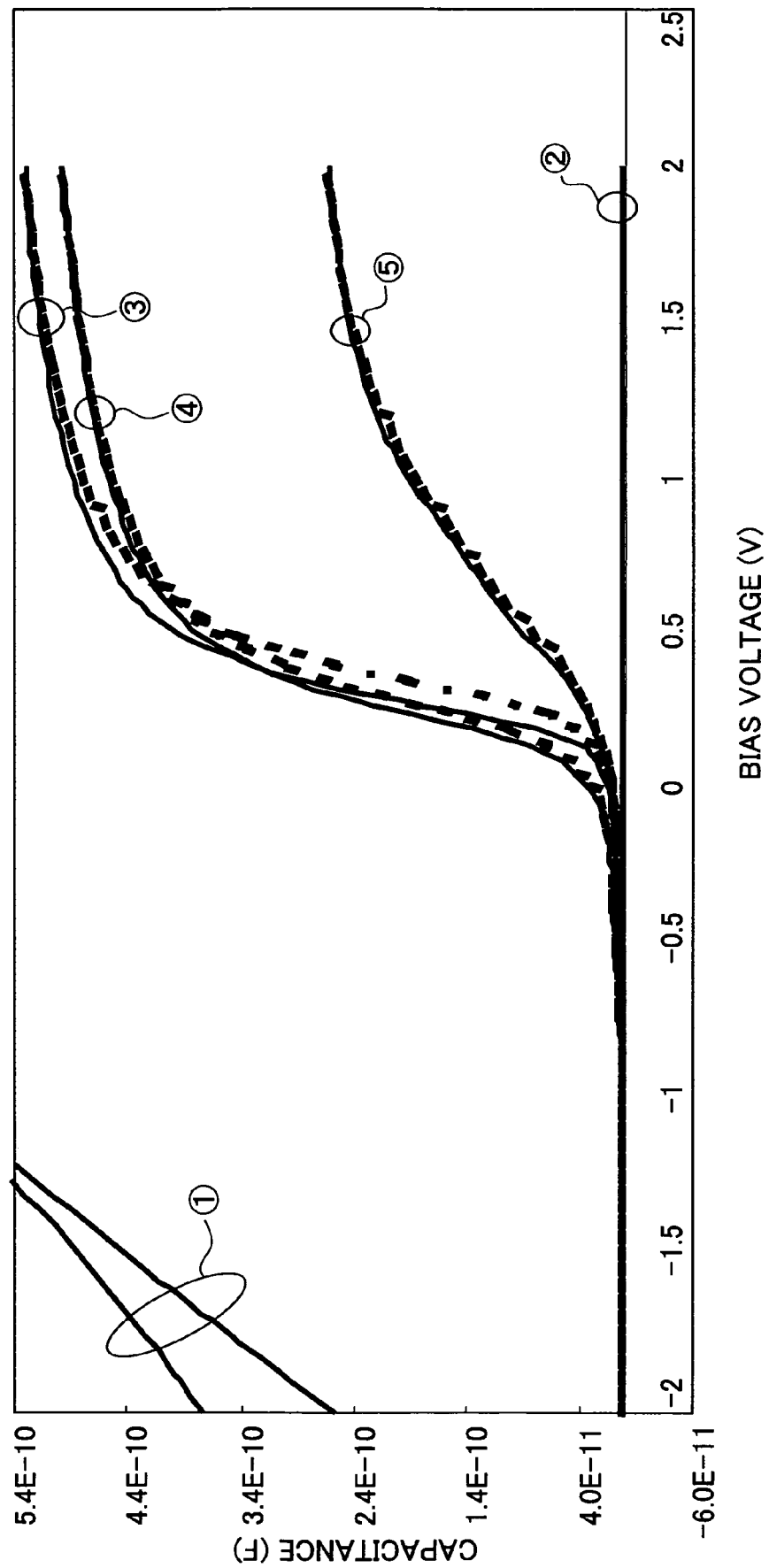

METHOD OF FORMING A DIELECTRIC FILM

CROSS-REFERENCE TO RELATED APPLICATIONS

The present invention is a continuation application filed under 35 U.S.C. 111(a) claiming benefit under 35 U.S.C.120 and 365(c) of PCT application PCT/JP2003/00369 filed on Jan. 17, 2003, the entire contents of which are incorporated herein as reference.

BACKGROUND OF THE INVENTION

The present invention generally relates to semiconductor devices and more particularly to a semiconductor device having a high dielectric film (so-called high-K dielectric film) formed of metal oxide or metal silicate and fabrication process thereof.

In the semiconductor integrated circuit devices for use for ultra fast operation such as CMOS LSIs, the field effect transistors (MOSFETs) constituting the semiconductor integrated circuit are required to have a very short gate length, and thus, intensive efforts have been made for miniaturization of MOSFETs.

Meanwhile, with such highly miniaturized MOSFETs, there is further imposed a constraint on the film thickness of the gate insulation film from scaling law, and there is a demand that the thickness of the gate insulation film is reduced to 2.5 nm or less in terms of the equivalent oxide film thickness.

Conventionally, a silicon oxide film characterized by excellent leakage current characteristics and low interface state density has been used for the gate insulation film.

However, with such a conventional gate insulation film of silicon oxide, there arises a problem of increased direct tunneling current with the decrease of physical thickness of the gate insulation film, and the problem of gate leakage current caused by tunneling current emerges as a paramount problem when the thickness of the gate insulation film has been decreased further from the foregoing value. With increase of the gate leakage current, there arises a substantial leakage current in the gate-off operational mode, and the semiconductor device no longer operates properly or there may be caused excessive increase of power consumption.

Thus, in order to solve the foregoing problems, investigations have been made on the use of high dielectric materials such as metal oxide or metal silicate having a high dielectric constant (referred to hereinafter as high-K dielectric film) for the material of the gate insulation film.

Conventionally, such a high-K dielectric film has been formed by an MOCVD process or atomic layer CVD (so-called ALD) process at the substrate temperature of 200-600° C. With the ALD process, it is possible to grow the high-K dielectric film one atomic layer by one atomic layer, by causing chemical adsorption of the source compound containing the metal element constituting the high-K dielectric film on the surface of the substrate to be processed, by supplying the source compound in the form of a source gas, followed by oxidation conducted by an oxidizing gas such as $H_2O$. By using such a film formation technology conducted at low temperature, it is now possible to grow a high-K dielectric film of excellent morphology characterized by uniform film thickness. Further, it is possible to obtain a high-K dielectric film of uniform thickness also by an MOCVD process.

On the other hand, the fabrication process of a semiconductor device includes plural ion injection processes in addition to such a formation process of high-K dielectric film, while it should be noted that an ion implantation process is inevitably accompanied with a rapid thermal annealing process conducted at about 1000° C., typically 1050° C., for activation of the impurity element introduced into the device region of the semiconductor substrate.

Thus, in the semiconductor device having such a gate insulation film of high-K dielectric film, the high-K dielectric gate insulation film has to maintain the excellent electric properties after such high temperature annealing process has been applied.

Further, in the case the gate insulation film contains defects such as fixed charges or interface states, there occurs trapping of carries by such fixed charges or interface states, leading to the problem of shift in the flat-band voltage or change of the threshold characteristics. Further, there is caused a large leakage current through these defects, and the reliability of the semiconductor device is degraded seriously. Thus, in the high-K dielectric gate insulation films, too, it is necessary that the film is free from fixed electric charges or interface states similarly to the case of conventional thermal oxide film.

However, the high-K dielectric film formed by such low temperature MOCVD or ALD process is an amorphous film, and while it has excellent morphology in a first glance, there is often the case that the film contains various defects in fact. Particularly, the film formed by an ALD process that uses $H_2O$ for the oxidizing agent tends to contain a large amount of OH group in the film.

Thus, in the investigation constituting the foundation of the present invention, the inventor of the present invention has made an investigation in which the high-K dielectric film of amorphous state and containing a large amount of defects is subjected to a thermal annealing process under the condition identical to the one used in the actual activation process of impurity elements, and observed the change of the film characteristics.

FIG. 1A shows the cross-sectional TEM image of an $HfO_2$ film formed by an ALD process in the foregoing investigation constituting the foundation of the present invention.

Referring to FIG. 1A, the $HfO_2$ film is formed on a silicon substrate carrying thereon an interface oxide film (thermal oxide film) having a thickness of 1 nm, by repeating the process of supplying a $HfCl_4$ gas and a $H_2O$ gas alternately with intervening purging step as shown in FIG. 2 at the substrate temperature of 300° C. so as to have the film thickness of 3 nm.

On the other hand, FIG. 1B shows the cross-sectional TEM image of the $HfO_2$ film of FIG. 1A after conducting an annealing process at 700° C. in a nitrogen gas ambient, followed by a further annealing process conducted at 1050° C. for 10 seconds.

Referring to FIG. 1B, there is caused a remarkable cohesion in the $HfO_2$ film on the silicon substrate as a result of the thermal annealing process conducted at such high temperature, and the continuous film morphology of the $HfO_2$ film with uniform thickness shown in FIG. 1A is lost. Further, associated with this, there is caused significant increase of leakage current with the structure of FIG. 1B. This means that the $HfO_2$ film of FIG. 1A, while having excellent morphology at a first glance, in fact contains large amount of defects in the film, and there is caused a large scale migration of atoms with the thermal annealing process via such defects. Such a film cannot be used for the gate insulation film of the high-speed semiconductor device.

In the TEM image of FIGS. 1A and 1B, it should be noted that the lattice image is resolved in the silicon substrate.

Patent Reference 1 Japanese Laid-Open Patent Application 11-177057

Patent Reference 2 Japanese Laid-Open Patent Application 2001-152339

SUMMARY OF THE INVENTION

Accordingly, it is a general object of the present invention to provide a novel and useful formation method of a dielectric film wherein the foregoing problems are eliminated.

Another and more specific object of the present invention is to provide a method of forming, on a substrate surface, a high-K dielectric film stable to thermal annealing process at high temperature.

In a first aspect, there is provided a method of forming a dielectric film on a substrate surface, comprising the steps of:

forming said dielectric film on said substrate surface in plural steps; and reforming, in each of said plural steps of forming said dielectric film, said formed dielectric film in an ambient primarily of nitrogen.

In another aspect of the present invention, there is provided a semiconductor device, comprising:

a substrate;

a high-K dielectric gate insulation film formed on said substrate;

a gate electrode formed on said high-K dielectric gate insulation film; and a pair of diffusion regions formed in said substrate at both lateral sides of said gate electrode, said high-K dielectric gate insulation film having a structure in which a molecular layer of high-K dielectric and a molecular layer of SiON are stacked repeatedly.

According to the present invention, by forming the high-K dielectric film in plural steps in the fabrication process of a semiconductor device that uses the high-K dielectric film as a gate insulation film, and further by reforming the high-K dielectric film in each of the foregoing plural steps, the atoms constituting the high-K dielectric film migrates in the high-K dielectric film to an equilibrium position, and the defects in the film are resolved. As a result, a high-K dielectric film stable against the activating thermal annealing process is obtained, even in the case an ion implantation process is conducted in the fabrication process of the semiconductor device that uses such a high-K dielectric film for the gate insulation film, and even in the case the activating thermal annealing process is conducted for activating the impurity element introduced into the substrate by ion implantation process. Particularly, by conducting the reforming step in the form of thermal annealing process in the nitrogen gas ambient added with oxygen, the interface between the semiconductor substrate and the high-K dielectric film is stabilized, and it becomes possible to suppress the occurrence of oxygen defect in the high-K dielectric film. Further, by introducing Si and N into the high-K dielectric film repeatedly, stability to the high temperature annealing is improved further and the leakage current is decreased. Further, the high-K dielectric film thus introduced with Si, O and N can effectively block the diffusion of impurity element such as B (boron) contained in the gate electrode. Thereby, it should be noted that the foregoing reforming step can be conducted by a plasma process.

Other objects and further features of the present invention will become apparent from the following detailed description of the preferred embodiment when conducted with reference to the drawings.

BRIEF DESCRIPTION OF THE DRAWINGS

FIGS. 1A and 1B are diagrams showing a high-K dielectric film formed by a conventional process and the problem thereof;

FIG. 2 is a diagram showing a conventional ALD process sequence;

FIGS. 3A-3D are diagrams explaining the forming method of a dielectric film according to a first embodiment of the present invention;

FIGS. 12A and 12B are diagrams showing the C-V characteristics of the MOS diode of FIG. 10 respectively before and after the high temperature annealing process;

DETAILED DESCRIPTION OF THE PREFERRED EMBODIMENT

First Embodiment

FIGS. 3A-3D show the method of forming a dielectric film according to a first embodiment of the present invention.

Referring to FIG. 3A, there is formed a high-K dielectric film 13 of $HfO_2$, or the like, on a silicon substrate 11 by an ALD process or MOCVD process with a thickness of about 0.6 nm corresponding to 2-3 atomic layers, via an interface oxide film 12 having a thickness of about 1 nm.

Figure 4:
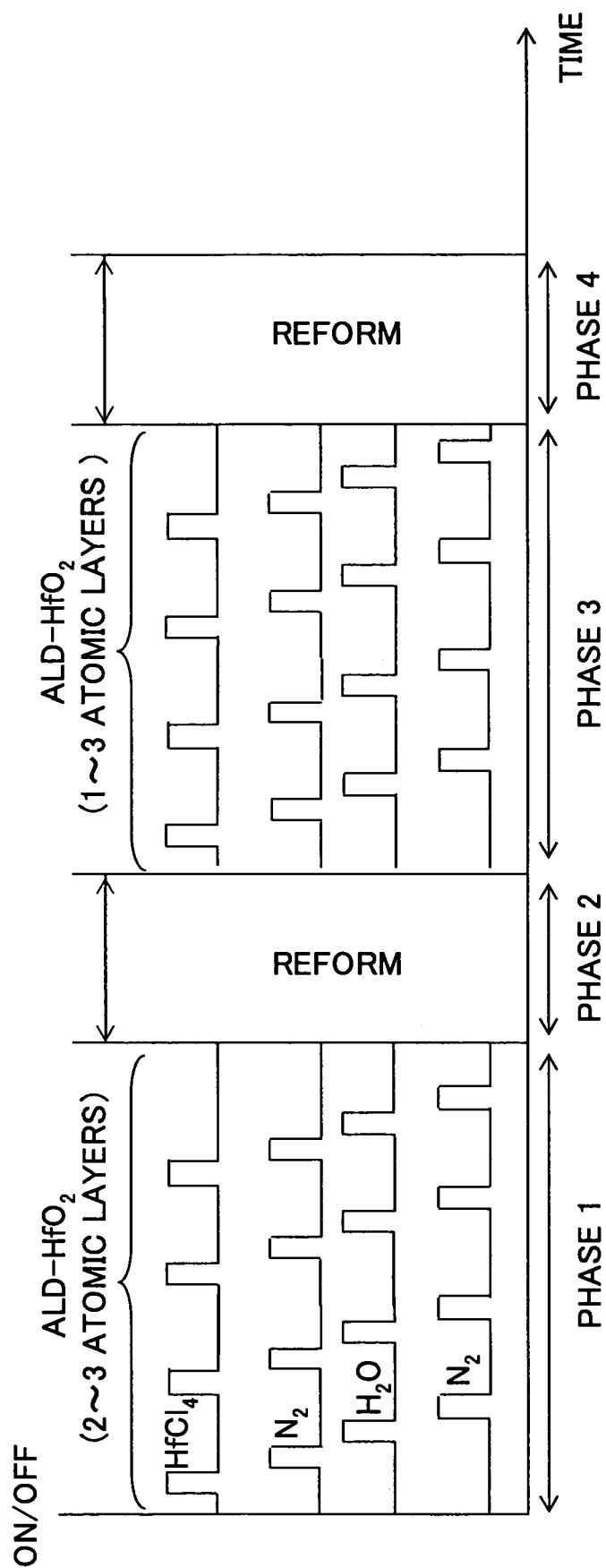
FIG. 4 is a diagram showing an ALD process sequence used with the first embodiment of the present invention.

In the case of forming the high-K dielectric film 13 by an ALD process, for example, the substrate temperature is set to 300° C. in the step of FIG. 3A, and a gaseous source such as $HfCl_4$ and a reacting agent such as $H_2O$ are supplied to a gas reaction apparatus while providing an intervening purging step by a nitrogen gas therebetween as shown by "PHASE 1" in FIG. 4. With such a process, the molecules of $HfCl_4$ are adsorbed upon the surface of the silicon substrate 11, more precisely upon the surface of the interface oxide film 12, and by oxidizing such adsorbed $HfCl_4$ molecules by an $H_2O$ gas, the $HfO_2$ film 13 is formed with the thickness of 2-3 atomic layers. Here, it should be noted that FIG. 4 is a diagram showing the process sequence used with the present embodiment. In the step of FIG. 3A, and thus in PHASE 1 of FIG. 4, it should be noted that the $HfO_2$ film is formed with the thickness of about 0.6 nm corresponding to 2-3 atomic layers as set forth before, by repeating the chemical adsorption process and oxidation process of the $HfCl_4$ molecules about eleven times.

The high-K dielectric film 13 thus formed with the step of FIG. 3A is subjected to a thermal annealing process in the step of FIG. 3B corresponding to PHASE 2 of the process sequence of FIG. 4 in nitrogen gas ambient at the temperature of 600-700° C. for 15 seconds, and as a result, the defects in the $HfO_2$ film 13 are resolved and the stress is relaxed. Further, as a result of such thermal annealing process, the $HfO_2$ film of amorphous state is crystallized. It should be noted that such a thermal annealing process of FIG. 3B can be conducted easily after the step of FIG. 3A by taking out the substrate to be processed from the ALD apparatus and moving the same to another processing chamber via a substrate transportation chamber of vacuum ambient.

Next, in the present embodiment, an ALD process for depositing an $HfO_2$ film is conducted again on the crystallized $HfO_2$ film in the step of FIG. 3C corresponding to PHASE 3 of the process sequence of FIG. 4, and a reformation processing of the $HfO_2$ film 13 is conducted in the step of FIG. 3D corresponding to PHASE 4 of the process sequence of FIG. 4, by again annealing the $HfO_2$ film 13 already deposited at the temperature of 600-700° C. for the duration of 15 seconds.

Further, by repeating the process steps of FIGS. 3C and 3D over plural times according to the needs as represented in the drawing by an arrow, a structure is obtained in which the $HfO_2$ film is formed on the silicon substrate 11 with a thickness of about 3.0 nm via the $SiO_2$ interface oxide film 2.

Figure 5:
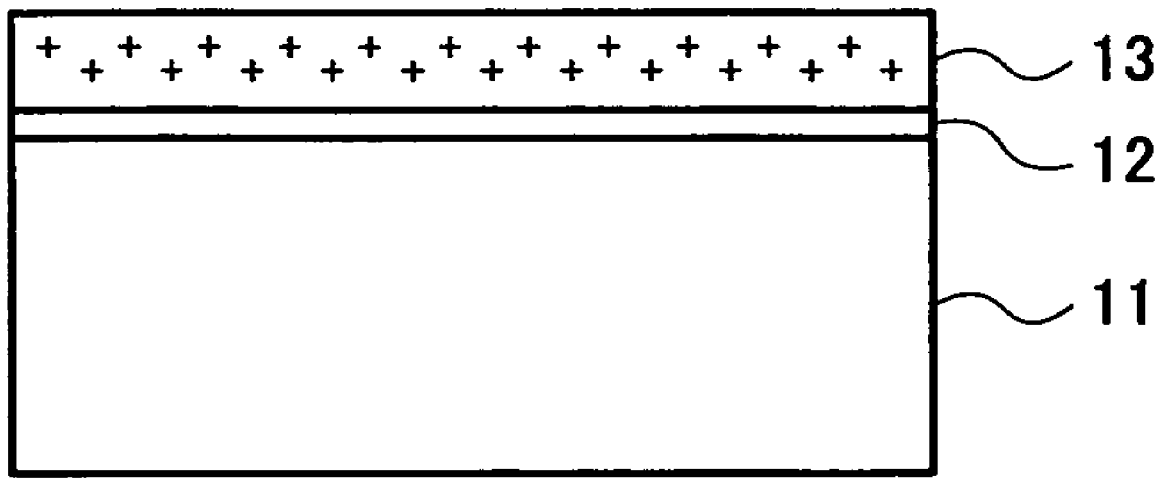
FIG. 5 is a diagram showing a high-K dielectric film formed with the first embodiment of the present invention.
Figure 6:
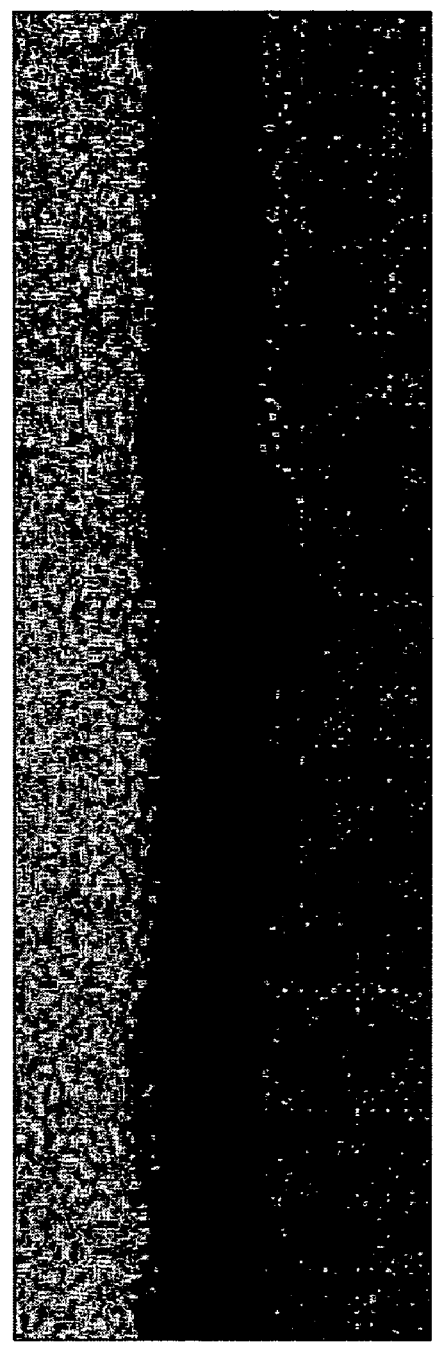
FIG. 6 is a diagram showing the high-K dielectric film of FIG. 5 after annealing the same at high temperature.

FIG. 6 is a TEM image showing the structure of FIG. 5 thus obtained in the state after a thermal annealing process is applied at the temperature of 1050° C. for 10 seconds, wherein it should be noted that this condition has been used conventionally for activating the impurity element introduced into the silicon substrate by an ion implantation process.

As shown in FIG. 6, the $HfO_2$ film 13 maintains a flat morphology even after such a high temperature thermal annealing process and it will be noted that the cohesion explained with reference to FIG. 1B does not take place. In the TEM image of FIG. 6, too, it should be noted that the lattice image of the silicon substrate 11 is resolved.

Figure 7:
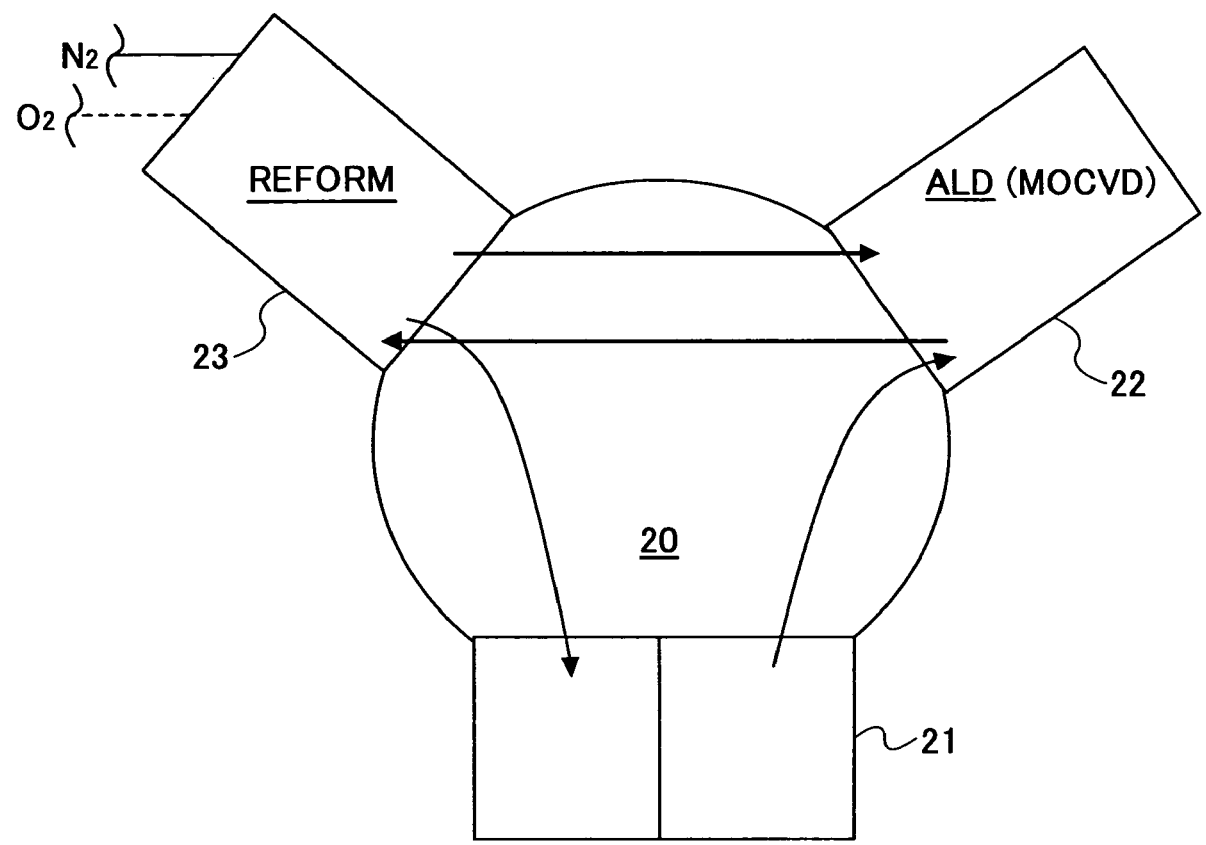
FIG. 7 is a diagram showing the construction of a single-wafer processing apparatus used with the first embodiment of the present invention.

FIG. 7 shows the schematic construction of a film forming apparatus used for the formation of the high-K dielectric film of the present embodiment.

Referring to FIG. 7, the film forming apparatus includes a vacuum transportation chamber 21 equipped with a robot transportation mechanism (not shown), wherein a load lock chamber, a deposition chamber 22 equipped with the ALD apparatus for conducting the process of FIG. 3A or 3C, and a reformation chamber 23 for conducting the step of FIG. 3B or 3D, are coupled with each other via the vacuum transportation chamber 21. Thereby, the substrate for processing, introduced via the load lock chamber 21, is forwarded to the deposition chamber 22, and, after moving back and forth between the deposition chamber 22 and the reformation chamber 23 according to the needs, the substrate for processing is finally returned to the load lock chamber 21.

By using a film forming apparatus of such a construction, it becomes possible to repeat the process of FIGS. 2A-2D continuously and repeatedly over a plurality of times as necessary, without exposing the substrate to the air.

In the present embodiment, a thermal annealing furnace held at the temperature of 500-800° C., preferably 600-700° C., is used for the reforming chamber 23 wherein the thermal processing furnace is supplied with a nitrogen gas and holds the substrate therein in a nitrogen gas ambient. With such a thermal annealing furnace, it is possible to suppress the oxygen concentration in the ambient and it becomes possible to carry out the thermal annealing process in a substantially oxygen-free ambient. Further, according to the needs, it is possible to supply an oxygen gas as shown in the drawing by a broken line for control of the oxygen partial pressure in the ambient.

Second Embodiment

Meanwhile, in the TEM image of FIG. 6, it can be seen that there is formed a defect in a part of the $SiO_2$ interface oxide film 12, and in correspondence to this defect, there is formed a reaction layer or transition layer in the silicon substrate 11.

While the composition of this transition layer is not known at the present juncture, there is a possibility that a part of the extremely thin interface oxide film 12 is reduced at the time of the thermal annealing process of FIG. 3B or FIG. 3D, which is conducted in the nitrogen gas ambient substantially free from oxygen, and there is caused a silicide formation as a result of reaction between Si and Hf in the $HfO_2$ film 13 thus formed.

Figure 8:
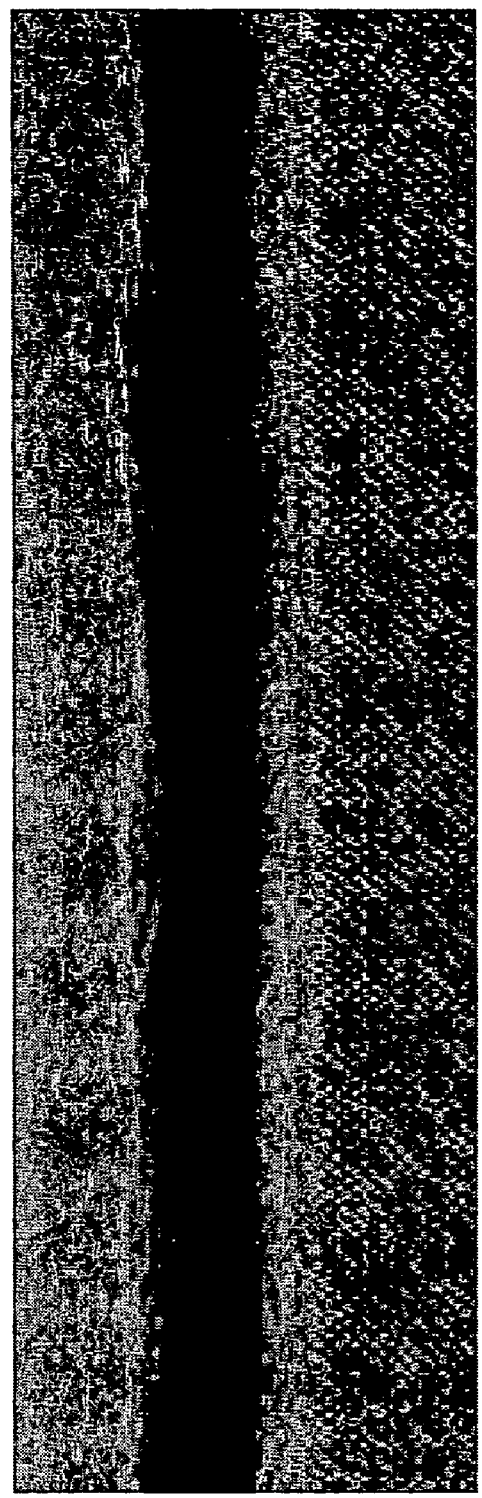
FIG. 8 is a diagram showing the high-K dielectric film formed with the second embodiment of the present invention in the state after a high temperature thermal annealing is applied.
Figure 9:
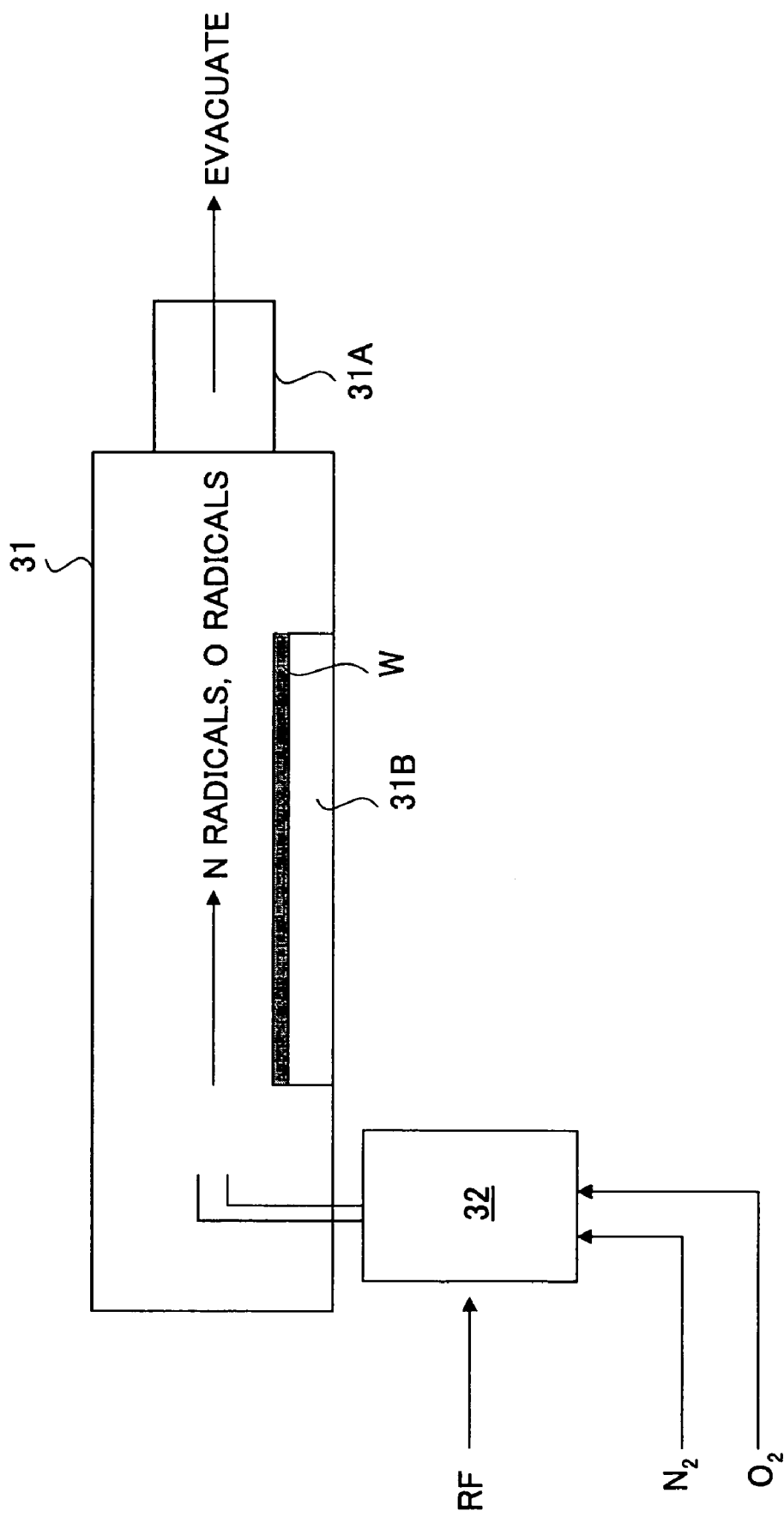
FIG. 9 is a diagram showing the construction of a film reforming apparatus used with the second embodiment of the present invention.

Contrary to this, FIG. 8 shows a TEM image of the specimen obtained by using the plasma nitridation apparatus 30 shown in FIG. 9 in the reforming chamber 23 of FIG. 7 and conducting the reforming processing of FIG. 3B or FIG. 3D in the plasma nitridation processing apparatus 30 at the temperature of 650° C. while adding a small amount of oxygen gas to the processing ambient. It should be noted that the illustrated structure is for the state after a high temperature thermal annealing process is applied to the specimen thus obtained at the temperature of 1050° C. for 10 seconds.

Referring to FIG. 9, the plasma nitridation processing apparatus 30 includes a processing vessel 31 provided with an evacuation port 31A and a stage 31B for holding a substrate W to be processed thereon, and a remote plasma source 32 is provided on the processing vessel 31, wherein the remote plasma source 32 is supplied with a nitrogen gas and an oxygen gas and forms the radicals of nitrogen and oxygen by exciting the nitrogen gas and the oxygen gas with an RF wave of 13.56 MHz. Alternatively, it is possible to supply a rare gas such as a He gas or an Ar gas in the remote plasma source as the plasma gas. By using such a remote plasma processing apparatus, it is possible to effectively suppress the charged particles associated with the plasma being incorporated into the high-K dielectric film.

In the apparatus of FIG. 9, the high-K dielectric film such as the $HfO_2$ film on the substrate W to be processed is exposed to the nitrogen radicals or oxygen radicals formed by the remote plasma source 32, and as a result, nitrogen atoms or oxygen atoms are introduced into the surface of the $HfO_2$ film.

Referring to FIG. 8 again, it will be noted with the present embodiment that the interface between the silicon substrate 12 and the interface oxide film 12 is stabilized as a result of admixing of oxygen to the ambient at the time of reforming processing of FIG. 3B or FIG. 3D. It can be seen that there is formed no defects such as the one observed in FIG. 6.

In the structure of FIG. 8, oxygen is contained in the ambient at the time of the reforming processing, and as a result, the thickness of the $SiO_2$ interface oxide film 12 is increased to 1.75 nm after the foregoing high temperature thermal annealing process. On the other hand, such increase of thickness of the interface oxide film 12 can be suppressed minimum such that there is caused no increase of film thickness in the $SiO_2$ interface oxide film 12, by controlling the oxygen partial pressure appropriately at the time of the reforming processing conducted by using the apparatus of FIG. 9.

In the present embodiment, it becomes possible to carry out the reforming processing at low temperature of 650° C. or less, by forming active radicals by the plasma nitriding processing apparatus 30 and by carrying out the reforming processing by using such radicals. In the case the reforming processing is conducted at such a low temperature, it becomes possible to eliminate the vacancy dangling bond in the high-K dielectric film 13 associated with the reforming processing and it becomes possible to suppress the formation of crystal grain boundary in the crystallized film.

Third Embodiment

Figure 10:
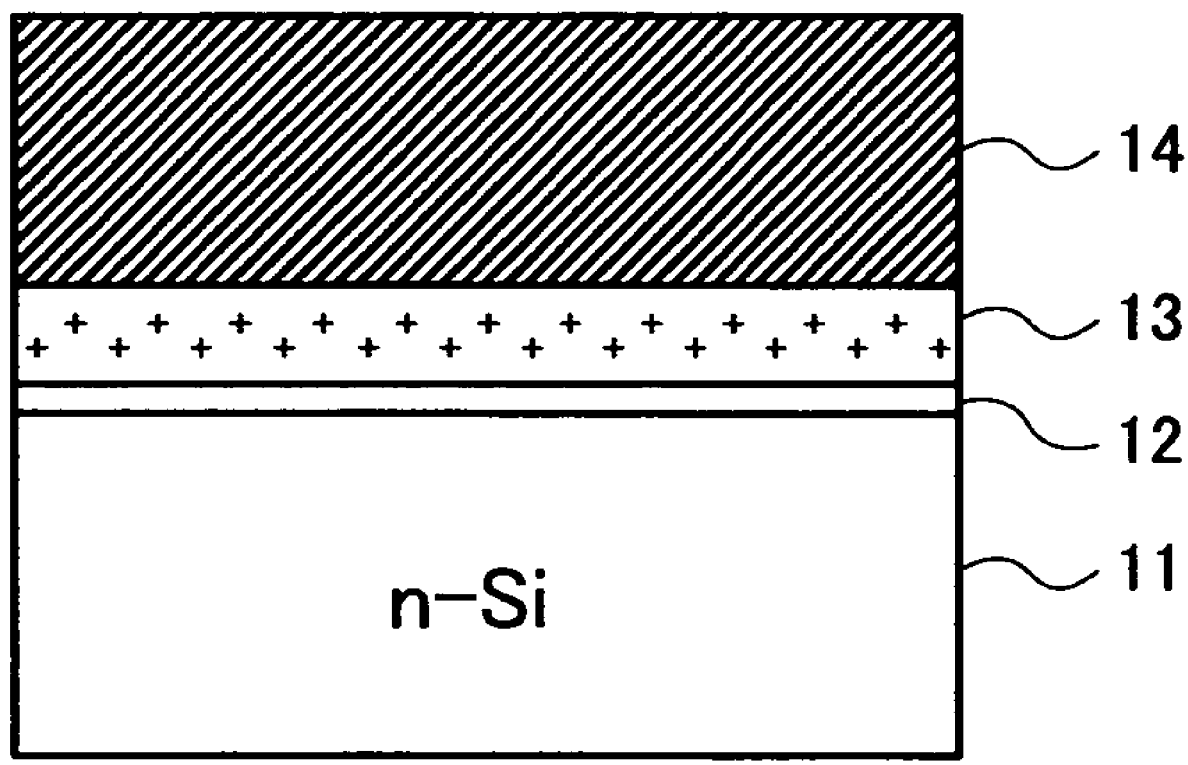
FIG. 10 is a diagram showing the construction of a MOS diode according to a third embodiment of the present invention.

FIG. 10 shows the construction of a MOS diode 10 having a capacitor insulation film formed of the high-K dielectric film thus formed on the silicon substrate, wherein those parts corresponding to the parts described previously are designated by the same reference numerals and the description thereof will be omitted.

Referring to FIG. 10, the present embodiment uses an n-type silicon substrate for the silicon substrate 11 and there is formed a platinum electrode 14 on the $HfO_2$ film 13 with a diameter of 200 μm.

In FIG. 10, it should be noted that the $SiO_2$ interface oxide film 12 and the $HfO_2$ film 13 constituting the MOS diode 10 have respective thicknesses of 1 nm and 3 nm in the as-deposited state corresponding to FIG. 1A.

Figure 11:
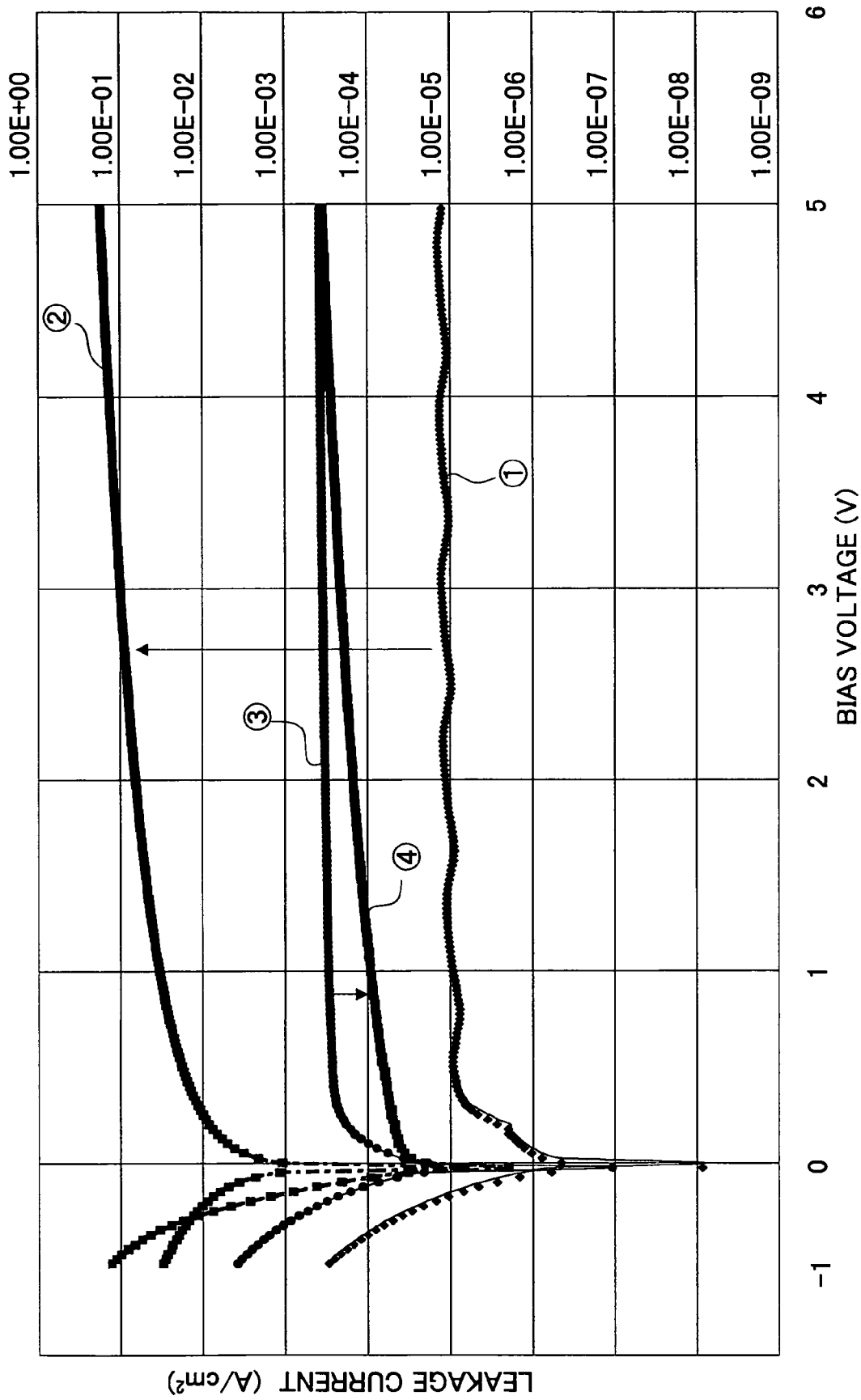
FIG. 11 is a diagram showing the leakage characteristics of the MOS diode of FIG. 10.

FIG. 11 shows the leakage current characteristics of the MOS diode 10 thus formed, wherein it should be noted that ① in FIG. 11 represents the leakage current characteristics for the structure in which the $HfO_2$ film 13 is formed by the ALD process conducted in two steps, with thermal annealing process applied in each of the deposition steps in a nitrogen gas ambient at 700° C., while ② represents the leakage current characteristics for the case the structure of ① above is subjected to a high temperature annealing process at 1050° C. for 10 seconds. Further, ③ represents the leakage current characteristics for the case in which the $HfO_2$ film 13 is formed by the ALD process in eleven cycles, with thermal annealing process applied in each of the cycles in a nitrogen gas ambient at 700° C. Further, ④ represents the leakage current characteristics for the case the structure of ③ above is subjected to a high temperature annealing process at 1050° C. for 10 seconds. In FIG. 11, the vertical axis represents the leakage current while the horizontal axis represents the voltage applied to the electrode 14.

Referring to FIG. 11, it can be seen that the leakage current increases significantly from ① to ② in the specimen in which the $HfO_2$ film 13 is formed in two steps. On the other hand, in the specimen in which the $HfO_2$ film 13 is formed in eleven steps, there occurs no significant change in the leakage current with the high temperature annealing process. Rather, it can be seen that there occurs a slight decrease of leakage current from ③ to ④.

Thus, FIG. 11 indicates that it is possible to improve the leakage current characteristics of the high-K dielectric film 13 by carrying out the film formation in plural steps at the time of formation of the high-K dielectric film 13 such as $HfO_2$ and by applying the reforming process in each of the steps, and that it is possible to achieve further improvement of the film quality by increasing the number of the cycles of repetition of film formation. Here, it should be noted that the film formation method is not necessarily be limited to an ALD process.

FIGS. 12A and 12B show the capacitance characteristics (C-V characteristics) of the MOS diode for the case the ambient in the reforming process has been changed variously at the time of formation of the MOS diode of FIG. 10, wherein it should be noted that FIG. 12A shows the characteristics before conducting the high temperature annealing process to such a MOS diode at 1050° C. for 10 seconds, while FIG. 12B shows the characteristics after the high temperature annealing process has been conducted.

Referring to FIGS. 12A and 12B, ① represents the case corresponding to the example of FIG. 1A, in which the $HfO_2$ film 13 is formed with the thickness of about 3 nm with the ALD process of FIG. 2, followed by a high temperature annealing process conducted at 1050° C. for 10 seconds, wherein it will be noted that measurement of leakage current is no longer possible. This means that there has been caused cohesion shown in FIG. 1B in the $HfO_2$ film.

Further, in FIGS. 12A and 12B, ② shows the example in which formation of the $HfO_2$ film 13 is conducted in three steps as shown in FIG. 4, each time with the thickness of 0.6 nm and by applying the reforming processing in an $NH_3$ ambient. It will be noted that the measured capacitance value becomes zero after high temperature annealing process conducted at 1050° C. for 10 seconds. This indicates that there have been caused oxygen defects in the $HfO_2$ film 13 due to the strong reducing ambient of $NH_3$.

Figure 13:
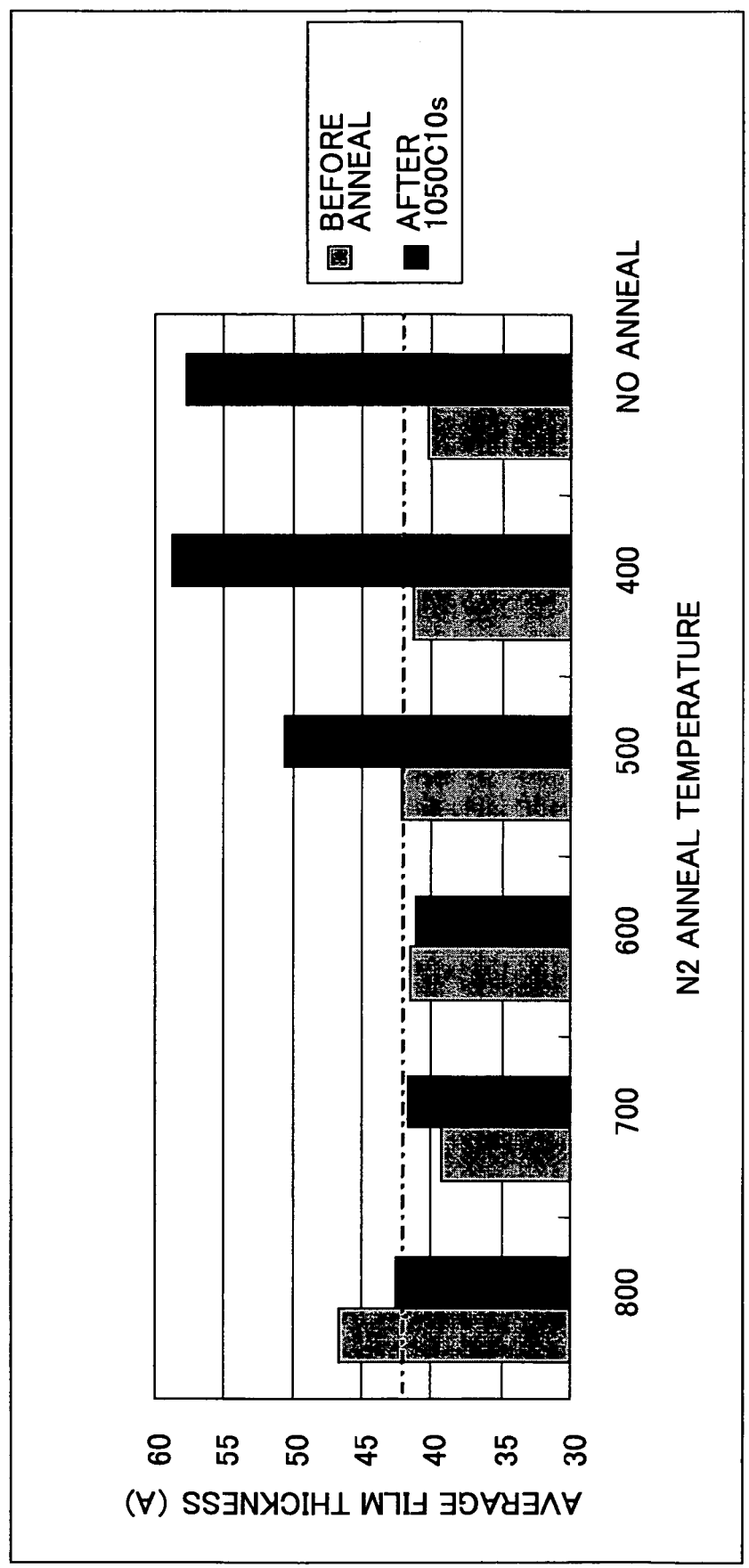
FIG. 13 is a diagram showing the relationship between the temperature of the reforming processing and the average film thickness of the obtained high-K dielectric film.

On the other hand, ③ represents the case in which formation of the $HfO_2$ film 13 is conducted in three steps, each time with 0.6 nm, according to the process sequence of FIG. 13, while applying the reforming processing in an NO ambient. In this case, it can be seen that the MOS diode 10 substantially maintains the capacitance before the thermal annealing process, even after the thermal annealing process is conducted at 1050° C. for 10 seconds.

Further, in FIGS. 12A and 12B, ④ shows the case in which the $HfO_2$ film 13 is formed in three steps, each time by 0.6 nm, according to the process sequence of FIG. 5, followed by carrying out the reforming processing with the remote plasma nitridation processing apparatus explained with reference to FIG. 9. In this case, it can be seen that the capacitance of the MOS diode has increased after the reforming processing.

Further, in FIG. 12B, ⑤ shows the result in which formation the $HfO_2$ film 13 is conducted in three steps, each time by 0.6 nm, according to the process sequence of FIG. 4, followed by conducting the reforming processing in a nitrogen gas ambient.

As explained previously, it is possible with the present invention to obtain a high-K dielectric film of improved stability at high temperatures and characterized by excellent electric properties, by forming the high-K dielectric film in as many plural steps as possible and performing the reforming processing each time. The result of FIGS. 12A and 12B indicates that there can be a case in which a high-K dielectric film of sufficient film quality from the practical view point is obtained in such a process of forming the high-K dielectric film in plural steps, by conducting the formation in three or more steps.

FIG. 13 compares the relationship between the thermal annealing temperature and the average film thickness of the $HfO_2$ film 13 for the case of carrying out the reforming process in the form of thermal annealing process conducted in a nitrogen gas ambient, before and after the high temperature annealing process conducted at 1050° C. for 10 seconds.

Referring to FIG. 13, it can be seen that there occurs a slight increase in the average thickness when the temperature of reforming process exceeds 800° C., indicating that there is caused the problem of cohesion of the $HfO_2$ film explained with reference to FIG. 1B at the time of the reforming processing. On the other hand, in the case of conducting the reforming processing by thermal annealing process, it will be noted that there occurs a remarkable increase in the average thickness before and after the reforming processing when the reforming processing is conducted at the processing temperature of 500° C. or less. In such a case, no effective reforming processing is possible.

Contrary to this, when the temperature of the reforming processing is set to 500° C. or more but not exceeding 800° C., it will be noted that there is caused no substantial change in the average film thickness before and after the high temperature annealing process and that the original flat morphology is maintained. Particularly, it is concluded that the range of 600-700° C. is preferable from the view point of change of the average film thickness.

Fourth Embodiment

Figure 14:
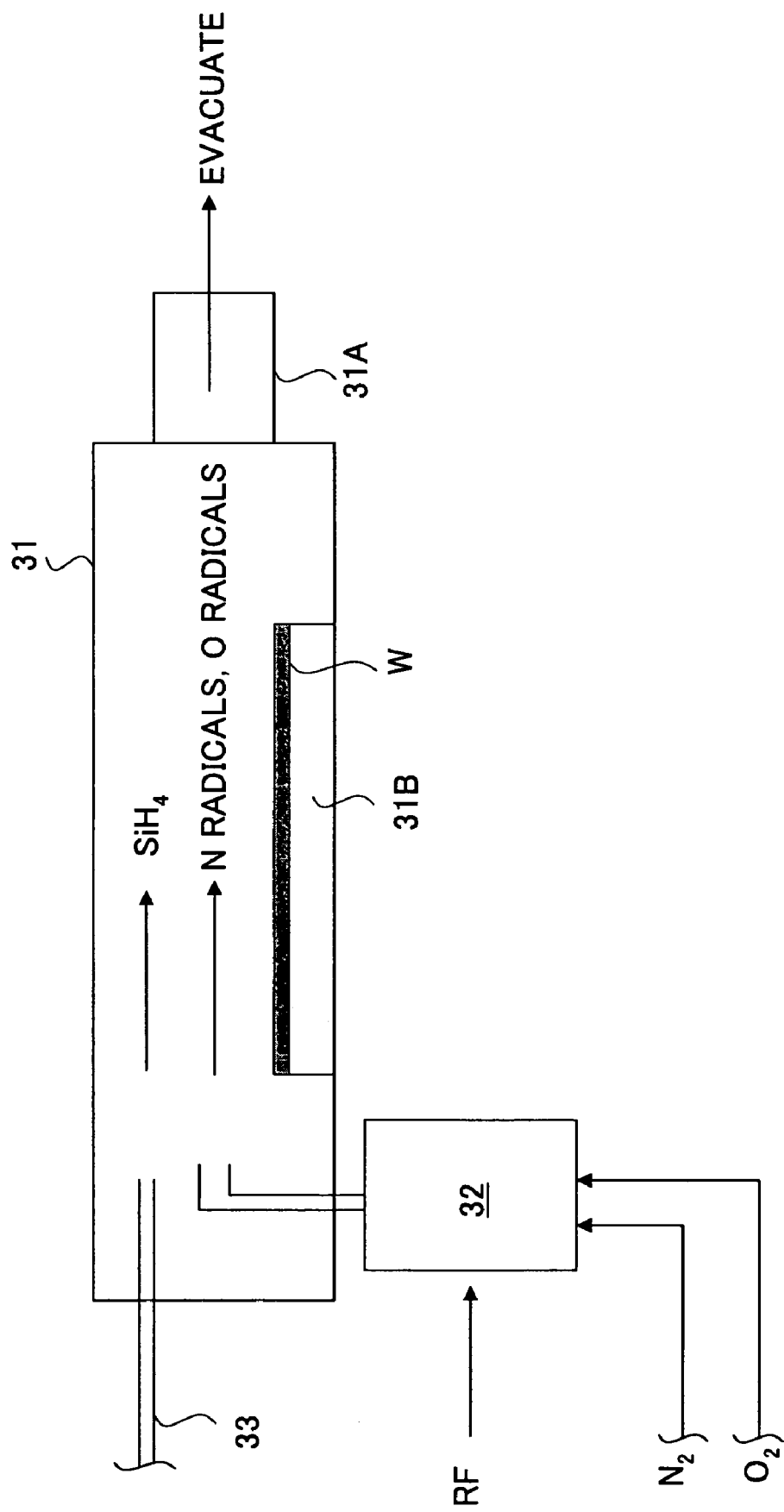
FIG. 14 is a diagram showing the construction of a film reforming apparatus used with a fourth embodiment of the present invention.

FIG. 14 shows the construction of a reforming processing apparatus 40 used with a fourth embodiment of the present invention, wherein those parts explained previously are designated by the same reference numerals and the description thereof will be omitted.

Referring to FIG. 14, with the reforming processing apparatus 40, the processing vessel 31 is supplied, in addition to the nitrogen radicals or oxygen radicals from the remote plasma nitridation processing apparatus 32, a silicon compound gas such as SiH4 from a line 33 for reforming of the surface of the high-K dielectric film, or the like, formed on the surface of the substrate W to be processed.

By using the reforming processing apparatus 40 of FIG. 14 for the processing chamber 23, there is formed a layer having Si—O—N bond on the surface of the $HfO_2$ film 13, and the stability of the film 13 to the high temperature thermal annealing process is improved significantly.

Figure 15:
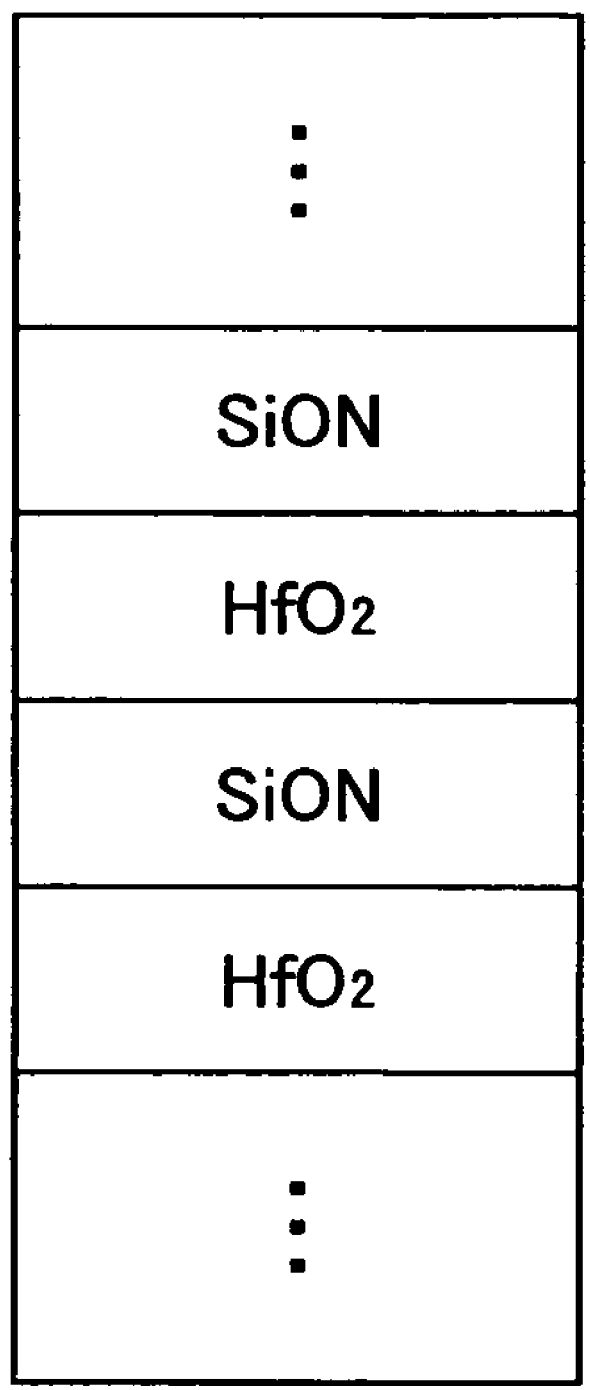
FIGS. 15 and 16 are diagrams showing the schematic construction of the high-K dielectric film obtained with the fourth embodiment of the present invention.
Figure 16:
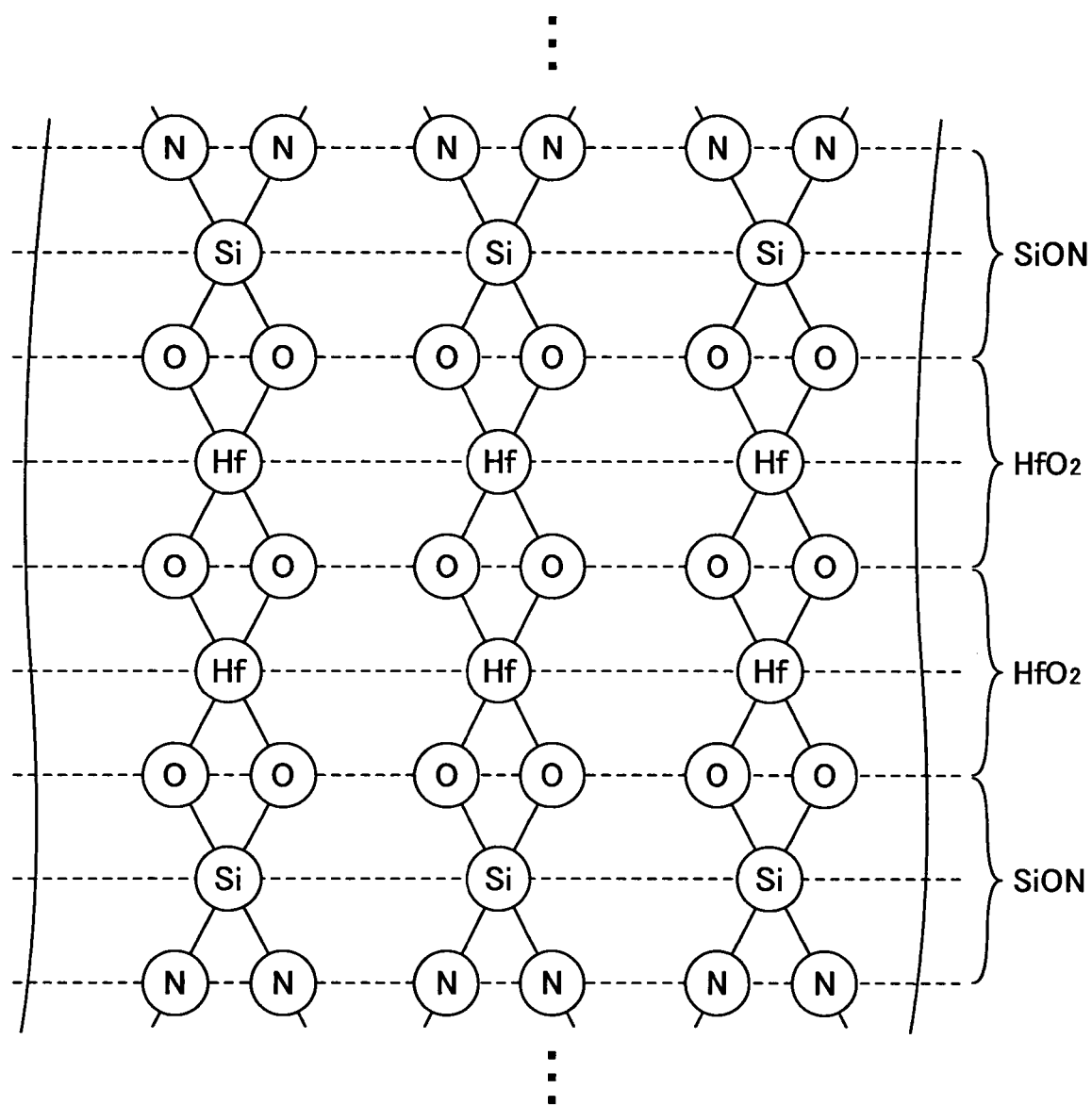

FIGS. 15 and 16 show the structure of the $HfO_2$ film thus formed by conducting the reforming processing at the temperature of 650° C. schematically.

Referring to FIG. 15, the $HfO_2$ film thus obtained includes a repetition of a $HfO_2$ layer and a SION layer shown in FIG. 16 in correspondence to the steps of FIGS. 2A-2D, wherein it can be seen in the illustrated example that a pair of SiON molecular layers are formed above and below two molecular layers of $HfO_2$.

By forming such a structure repeatedly as shown in FIG. 15, it is possible to form a high-K dielectric film containing a N—Si—O bond therein. With the high-K dielectric film including the Ni—Si—O bond in the film, migration of atoms in the film is blocked by the SiON layer, and excellent stability is achieved for the high temperature annealing process. Further, excellent resistance is achieved against the diffusion of B (boron), or the like, from the gate electrode.

Figure 17:
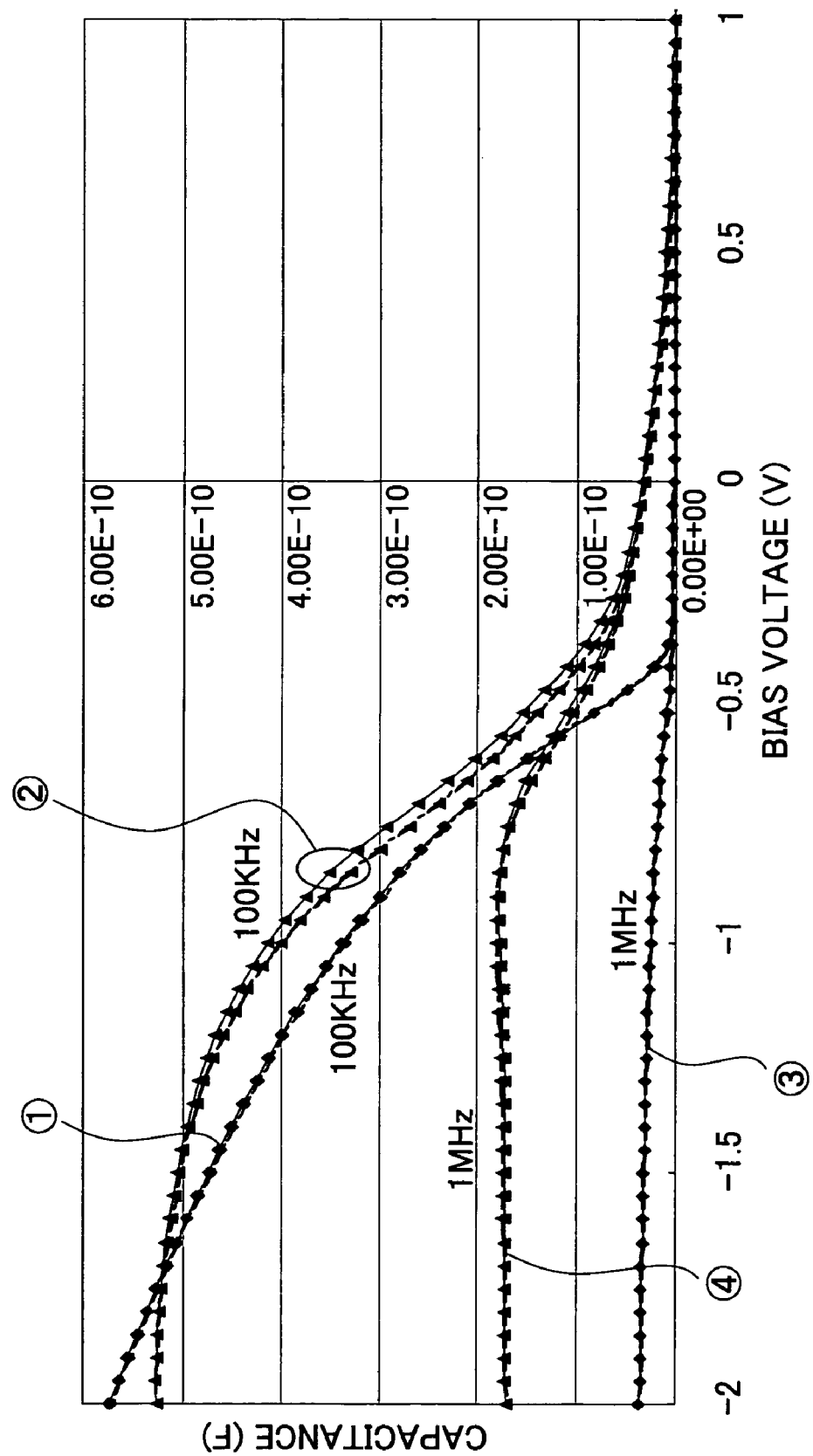
FIG. 17 is a diagram showing the C-V characteristics of the MOS diode of FIG. 10 for the ease the high-K dielectric film is formed according to the fourth embodiment of the present invention.

FIG. 17 shows the result of measurement of the capacitor characteristics (C-V characteristic) measured at the frequencies of 100 MHz and 1 MHz for the MOS diode of FIG. 10 that uses an $HfO_2$ film having the thickness of 3 nm, the $HfO_2$ film including the Si—N bond as a result of such a remote plasma processing.

Referring to FIG. 17, ① and ③ are comparative examples, wherein ① represents the C-V characteristic of the MOS diode at the frequency of 100 kHz for the case the $HfO_2$ film 13 formed with the thickness of 3 nm by the ALD process shown in FIG. 2 is annealed at 700° C. after the film formation in a nitrogen gas ambient, while ③ represents the C-V characteristic of the MOS diode having the same $HfO_2$ film 13 at the frequency of 1 MHz. Thus, with ① and ③, the high temperature anneal processing at 1050° C. is not applied.

Contrary to this, ② represents the C-V characteristic at the frequency of 100 kHz for the case the $HfO_2$ film 13 of 3 nm is formed in three steps each time with 0.6 nm according to the process sequence of FIG. 4 wherein introduction of Si, O and N is made into the film in each of the film forming steps by using the remote plasma nitriding apparatus, followed by the high temperature annealing process conducted at 1050° C. for 10 seconds. Further, ④ represents the C-V characteristic of the MOS diode that uses the same $HfO_2$ film 13 at the frequency of 1 MHz.

As can be seen from FIG. 17, the characteristic ② is generally identical with the characteristic ① at the frequency of 100 kHz, while at the frequency of 1 MHz, the characteristic ④ subjected to the high temperature annealing process at 1050° C. provides a superior result over the characteristic ③ in which this high temperature annealing process is not applied. This result indicates that, in the case of ② and ④, while the film contains the SiON layer that works to cause decrease of the specific dielectric constant of the $HfO_2$ film 13, the defects in the film are also resolved with such a construction, and it is believed that this is the reason why an electric property superior to the $HfO_2$ films of ① or ③ is obtained in the case the high temperature annealing process is applied.

Figure 18:
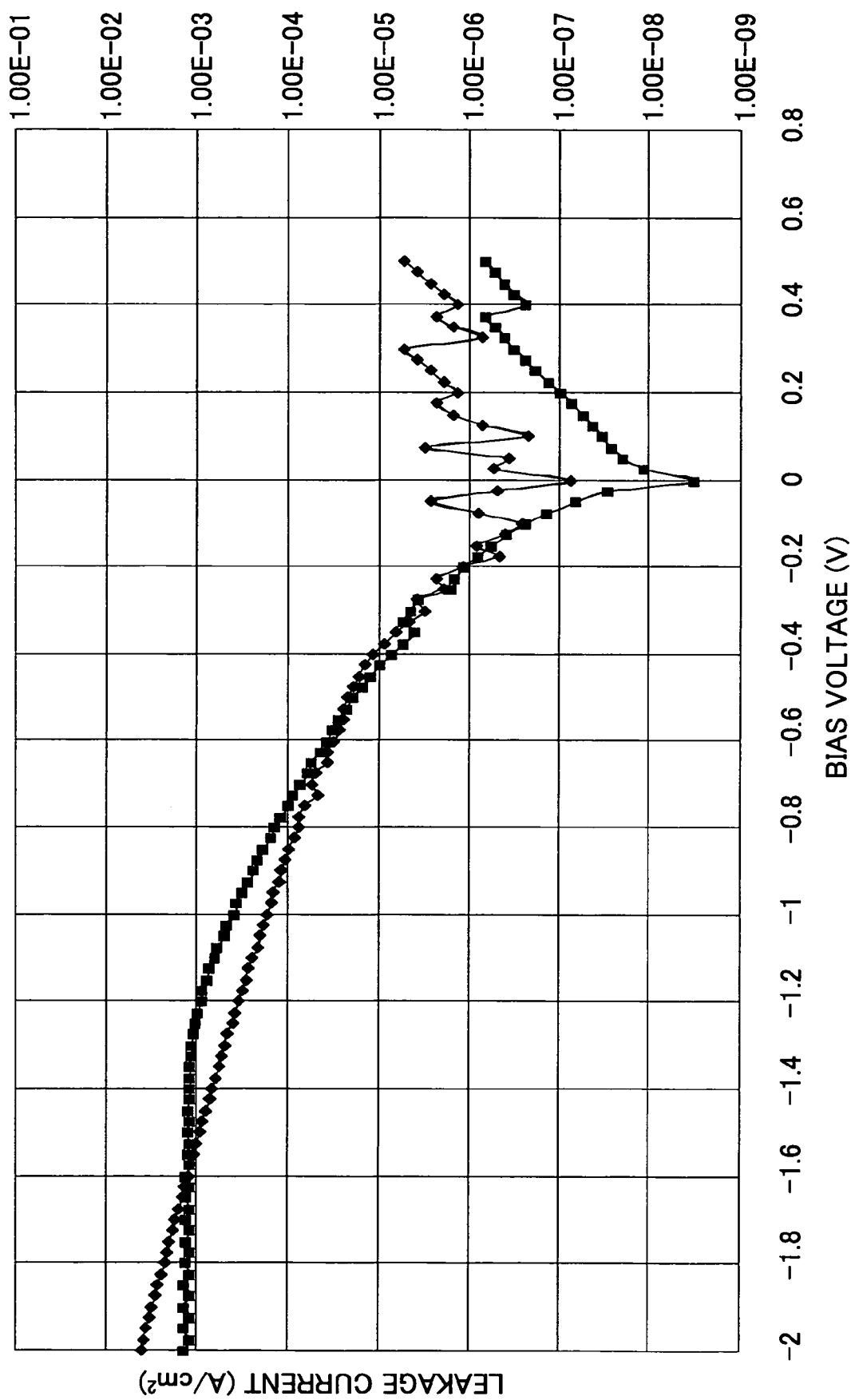
FIG. 18 is a diagram showing the leakage characteristics of the MOS diode of FIG. 10 for the case the high-K dielectric film is formed according to the fourth embodiment of the present invention.

FIG. 18 compares the leakage current between the MOS diode of ① or ③ of FIG. 17 and the MOS diode ② or ④, wherein ♦ of FIG. 18 represents the leakage current of the MOS diode of FIG. 10 in the case the $HfO_2$ film, formed by the ALD process with the thickness of 3 nm, is annealed in a nitrogen gas ambient at 700° C., while □ represents the leakage current for the case N, O and Si are introduced into the film by conducting the reforming process with the remote plasma nitridation processing apparatus according to the process sequence of FIG. 4 and a high temperature annealing process is applied further to the $HfO_2$ film thus reformed at the temperature of 1050° C. for 10 seconds.

As can be seen from FIG. 18, the leakage characteristic is improved by forming the $HfO_2$ film in plural steps and further applying the high temperature annealing process in each of the plural steps.

As explained before, it is also possible with the present embodiment to carry out the reforming processing at the low temperature of 650° C. or less, by performing the reforming process by forming active radicals the plasma nitridation processing apparatus 40 and by using the radicals thus formed. In the case the reforming processing is conducted at such a low temperature, it becomes possible to suppress the crystallization of the high-K dielectric film 13 associated with the reforming processing, and formation of grain boundaries in the crystallized film is suppressed. As a result, it becomes possible to cut off the leakage current path formed along the crystal grain boundaries.

Thereby, by introducing the SiON component forming an amorphous film by itself into the high-K dielectric film, it becomes possible with the present embodiment to suppress the crystallization of the high-K dielectric film even after conducting the high-temperature annealing process used for activating the impurity elements, and it becomes possible to suppress formation of leakage current path associated with grain boundary formation or formation of defects such as interface state.

Fifth Embodiment

FIGS. 19A-19F show the fabrication process of a semiconductor device according to a fifth embodiment of the present invention.

Figure 19A:
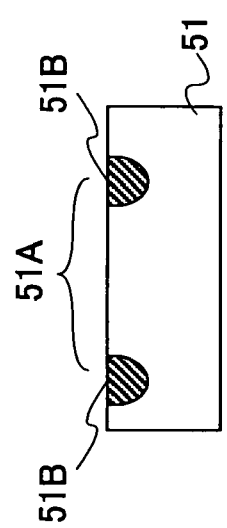
FIGS. 19A-19F are diagrams showing the fabrication process of a semiconductor device according to a fifth embodiment of the present invention.
Figure 19B:
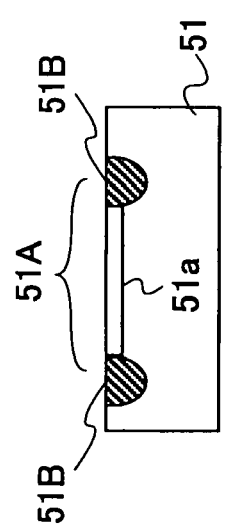

Referring to FIG. 19A, a device isolation region 51B defining a device region 51A is formed on a p-type silicon substrate 51, and a channel dope region 51a is formed in the device region 51A in the step of FIG. 19B by introducing As or P into the device region 51A by way of ion implantation.

Figure 19C:
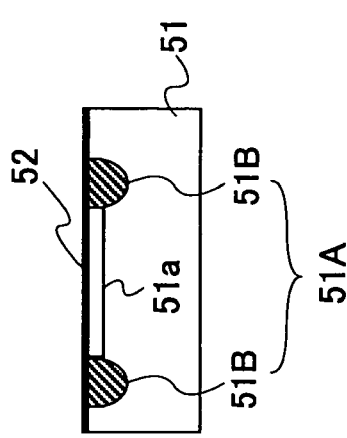

Further, in the step of FIG. 19C, a thermal oxide film is formed on the structure of FIG. 19B uniformly with a thickness of about 1 nm in correspondence to the interface oxide film 12, and a gate insulation film 52 is formed by forming a high-K dielectric film such as $HfO_2$ on the interface oxide film with a thickness of about 3 nm according to the process sequence of FIG. 4.

Figure 19D:
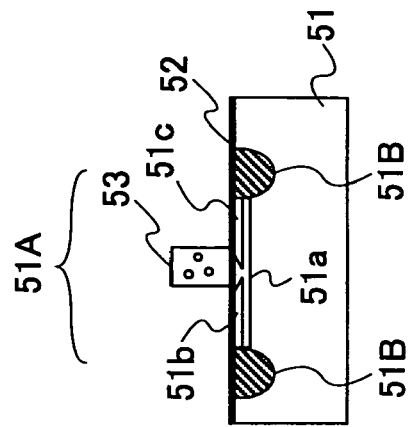

Further, in the step of FIG. 19D, a polysilicon film is deposited on the gate insulation film 52 uniformly, and a polysilicon gate electrode 53 is formed by patterning the polysilicon film thus deposited. With the present embodiment, the polysilicon gate electrode 53 has a gate length of 0.1 μm or less.

Further, in the step of FIG. 19D, pocket injection of As or P is conducted obliquely to the device region 51A while using the polysilicon gate electrode 53 as a mask. Further, by conducting an extension injection process subsequently, a source extension region 51b and a drain extension region 5c are formed in the device region 51A at both lateral sides of the gate electrode 53.

Figure 19E:
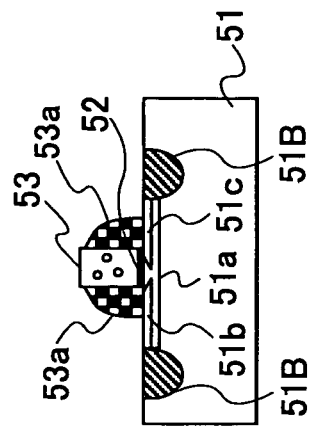
Figure 19F:
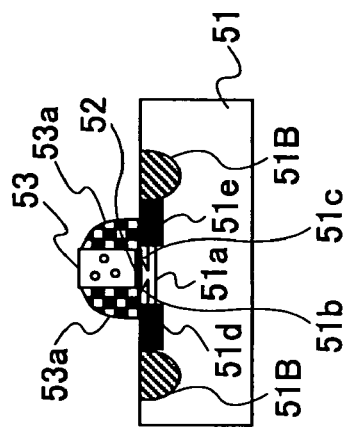

Further, in the step of FIG. 19E, sidewall insulation films 53a are formed at both lateral sides of the gate electrode 53, and source and drain regions 51d and 51e are formed further in the step of FIG. 19F by introducing As or P ions by an ion implantation process while using the gate electrode 53 and the sidewall insulation films 53a as a mask.

In the present embodiment, it should be noted that the high-K dielectric film constituting the gate insulation film is formed in the step of FIG. 19C in the form of plural steps with intervening reforming steps as explained with reference to FIG. 4. Thereby, PHASE 1 and PHASE 3 may be any of ALD process or MOCVD process and PHASE 2 and PHASE 4 may be any of thermal annealing process in a nitrogen gas ambient or a nitrogen gas ambient admixed with oxygen. Alternatively, PHASE 2 and PHASE 4 may be conducted by a plasma nitridation process or a plasma nitridation process admixed with oxygen. Further, PHASE 2 and PHASE 4 may be conducted in the form of plasma nitridation processing added with a Si compound such as $siH_4$ and oxygen.

By forming the gate insulation film 52 as such, durability of the high-K dialectic film in the gate insulation film 52 against the thermal annealing process is improved, and there occurs no defect formation in the film such as cohesion even in the case of activating the impurity element such as As or P introduced into the source extension region 51a, drain extension region 51b, source region 51d and drain region 5le by way of high temperature annealing process. Further, with the gate electrode 52 thus formed, excellent electric properties characterized by small leakage current and good C-V characteristic, is maintained after the high temperature activation annealing process.

It should be noted that while the foregoing explanation has been made for the case of forming the $HfO_2$ film by an ALD process, it is also possible to form the $HfO_2$ film by an MOCVD process. In this case, it is possible to use TDEAH (tetrakis diethylamido hafnium: $Hf[N(C_2H_5)_2]_4$), TDMAH (tetrakis dimethylamido hafnium $Hf[N(CH_3)_2]_4$), and the like, for the metal organic source. Further, the source used for forming the $HfO_2$ film by the ALD process is not limited to $HfCl_4$ but it is also possible to use TDMAH, or the like.

Further, the high-K dielectric film of the present invention is not limited to $HfO_2$, but metal oxide, transitional metal oxide or rare earth oxide such as $ZrO_2$, $Al_2O_3$, $Ta_2O_5$, $Y_2O_3$, and the like, or silicate or aluminate of transitional metal or rare earth metal such as $HfSiO_4$, $ZrSiO_4$, or the like, can be used for the high-K dielectric film.

Further, while explanation has been made in FIG. 7 for the example in which formation of the high-K dielectric film and the reforming processing are made by a single wafer processing apparatus by transporting the substrate between different processing chambers, it is also possible to carry out the formation of the high-K dielectric film and the reforming processing in a single processing apparatus while switching the processing gas.

Further, with the present invention, it is also possible to carry out the reforming processing in an ambient of nitrogen gas to which one or more of oxygen, NO, $O_3$, $SiH_4$, $Si_2H_6$, $NH_3$, $H_2$ and He are added.

Further, while explanation has been made heretofore for the case of using the high-K dielectric film to the gate insulation film of high-speed semiconductor devices, it is also possible to use the present invention for the fabrication of DRAM having a capacitor insulation film of high-K dielectric film.

Further, the present invention is not limited to the embodiments described heretofore, but various variations and modifications may be made without departing from the scope of the invention.

What is claimed is:

1. A method of forming a dielectric film on a substrate surface, comprising the steps of:
    forming said dielectric film on said substrate surface in plural steps; and
    reforming, in each of said plural steps of forming said dielectric film, said dielectric film in an ambient primarily of nitrogen,
    wherein said step of reforming comprises a thermal annealing process,
    said thermal annealing process is conducted at a temperature of 500 C or more but not exceeding 800 C, and
    wherein said ambient further contains gaseous molecules of a Si compound.

2. The method as claimed in claim 1, wherein said ambient further contains oxygen.

3. The method as claimed in claim 1, wherein said ambient is added with one or more gases selected from the group consisting of NO, O3, SiH4, Si2H6, NH3, H2 and He.

4. The method as claimed in claim 1, wherein said thermal annealing process is conducted at a temperature of 600-700° C.

5. The method as claimed in claim 1, wherein said step of reforming comprises a plasma process.

6. The method as claimed in claim 5, wherein said plasma process exposes said dialectic film to nitrogen radicals.

7. The method as claimed in claim 6, wherein said plasma process further exposes said dielectric film to oxygen radicals.

8. The method as claimed in claim 7, wherein said plasma process further exposes said dielectric film to molecules of a Si compound.

9. The method as claimed in claim 5, wherein said plasma process is conducted by a remote plasma processing.

10. The method as claimed in claim 5, wherein said plasma process is conducted at a temperature of 650° C. or less.

11. The method as claimed in claim 1, wherein each of said plural steps for forming said dielectric film is conducted by an ALD process.

12. The method as claimed in claim 1, wherein each of said plural steps for forming said dielectric film is conducted by an MOCVD process.

13. A method of fabricating a semiconductor device comprising a substrate, a high-K dielectric gate insulation film formed on said substrate, a gate electrode formed on said high-K dielectric gate insulation film, and a pair of diffusion regions formed in said substrate at both lateral ends of said gate electrode, said method comprising the steps of:

forming said high-K dielectric gate insulation film on said substrate in plural steps; and reforming, in each of said plural steps of forming said high-K dielectric film, said high-K dielectric film in an ambient primarily of nitrogen, wherein said step of reforming comprises a thermal annealing process, said thermal annealing process is conducted at a temperature of 500 C or more but not exceeding 800 C, and wherein said ambient further contains gaseous molecules of a Si compound.

14. The method as claimed in claim 13, wherein said ambient further contains oxygen.

* * * * *